United States Patent
Zhao et al.

(10) Patent No.: US 9,023,940 B2
(45) Date of Patent: May 5, 2015

(54) ADDITION-TYPE ORGANOSILICON SEALANT FOR HALOGEN-FREE CONDUCTIVE AND FLAME-RESISTANT ELECTRIC PRODUCTS

(76) Inventors: Yuangang Zhao, Sichuan (CN); Nanping Lu, Sichuan (CN)

( * ) Notice: Subject to any disclaimer, the term of this patent is extended or adjusted under 35 U.S.C. 154(b) by 0 days.

(21) Appl. No.: 14/237,059

(22) PCT Filed: Aug. 1, 2012

(86) PCT No.: PCT/CN2012/079533
§ 371 (c)(1),
(2), (4) Date: Feb. 4, 2014

(87) PCT Pub. No.: WO2013/017090
PCT Pub. Date: Feb. 7, 2013

(65) Prior Publication Data
US 2014/0206816 A1    Jul. 24, 2014

(30) Foreign Application Priority Data
Aug. 4, 2011  (CN) .......................... 2011 1 0222262

(51) Int. Cl.
*C09K 3/10* (2006.01)
*C08L 83/06* (2006.01)
*H01L 23/29* (2006.01)
*C08G 77/12* (2006.01)
*C08G 77/14* (2006.01)
*C08G 77/20* (2006.01)

(52) U.S. Cl.
CPC .............. *C09K 3/1018* (2013.01); *C08G 77/12* (2013.01); *C08G 77/14* (2013.01); *C08G 77/20* (2013.01); *C08L 83/06* (2013.01); *H01L 23/296* (2013.01); *H01L 2924/0002* (2013.01)

(58) Field of Classification Search
None
See application file for complete search history.

(56) References Cited

U.S. PATENT DOCUMENTS

| 4,082,726 | A | * | 4/1978 | Mine et al. ....................... 528/31 |
| 4,243,718 | A | * | 1/1981 | Murai et al. .................... 428/447 |
| 4,732,932 | A | * | 3/1988 | Waldern ........................ 524/862 |
| 5,342,870 | A | * | 8/1994 | Stein et al. ..................... 524/188 |
| 5,399,650 | A | * | 3/1995 | Bilgrien ........................... 528/15 |
| 5,434,214 | A | * | 7/1995 | Wolosen et al. .............. 524/720 |
| 5,445,891 | A | * | 8/1995 | Kasuya .......................... 428/450 |
| 5,977,226 | A | * | 11/1999 | Dent et al. ..................... 524/267 |
| 6,025,435 | A | * | 2/2000 | Yamakawa et al. ........... 524/862 |
| 6,734,250 | B2 | * | 5/2004 | Azechi et al. ................. 524/588 |
| 6,835,241 | B2 | * | 12/2004 | Tsuchida et al. ......... 106/287.15 |
| 7,825,177 | B2 | * | 11/2010 | Hara ............................. 524/261 |
| 2004/0254275 | A1 | * | 12/2004 | Fukui et al. .................... 524/261 |
| 2005/0234181 | A1 | * | 10/2005 | Ikeno et al. .................... 524/493 |
| 2007/0219312 | A1 | * | 9/2007 | David ........................... 524/588 |
| 2009/0026756 | A1 | * | 1/2009 | Bowman ...................... 285/21.2 |
| 2010/0028685 | A1 | * | 2/2010 | White et al. ................... 428/413 |
| 2010/0043945 | A1 | * | 2/2010 | Dohner et al. .................. 156/98 |
| 2010/0282410 | A1 | * | 11/2010 | Pouchelon et al. ........... 156/329 |
| 2010/0323203 | A1 | * | 12/2010 | Huck .......................... 428/425.5 |
| 2012/0184663 | A1 | * | 7/2012 | Hamamoto et al. ........... 524/500 |

FOREIGN PATENT DOCUMENTS

| CN | 101054507 | 10/2007 |
| CN | 101280168 | 10/2008 |
| CN | 101735619 | 6/2010 |
| CN | 102002240 | 4/2011 |
| CN | 102408869 | 4/2012 |
| JP | 9151322 | 6/1997 |

OTHER PUBLICATIONS

International Search Report for international application No. PCT/CN2012/079533, dated Oct. 18, 2012 (6 pages).

* cited by examiner

*Primary Examiner* — Robert S Loewe
(74) *Attorney, Agent, or Firm* — Hamre, Schumann, Mueller & Larson, P.C.

(57) ABSTRACT

This invention refers to an addition-type organosilicon sealant for halogen-free conductive and flame-resistant electric products, which consists of: A) vinyl silicone oil; B) silicon dioxide treated by silane or aluminum oxide treated by silane; C) a compound in which every molecule contains H—Si functional group, the mass content of H is 0.1-1.2%; D) hydrolysis product from hydrolysis reaction between Vinyl trimethoxy(triethoxy) silane and γ-(2,3-epoxy propoxy) propyl trimethoxy(triethoxy) silane; E) chloroplatinic acid or 1,3-divinyl-1,1,3,3-tetramethyl disiloxane platinum complex; F) any one or combination of carbon black, iron black, titanium dioxide, cerium oxide, benzotriazole, zinc carbonate and magnesium carbonate. The substance provided by this invention, which is halogen-free and flame-resistant with certain heat conductivity and viscosity, is quite applicable to sealing of electric products.

11 Claims, No Drawings

ADDITION-TYPE ORGANOSILICON SEALANT FOR HALOGEN-FREE CONDUCTIVE AND FLAME-RESISTANT ELECTRIC PRODUCTS

TECHNICAL FIELD

This invention refers to an addition-type organosilicon sealant for halogen-free conductive and flame-resistant electric products, which applies to sealing of electric products with halogen-free, flame-resistant and certain adhesive requirements.

BACKGROUND TECHNOLOGY

With development of science and technology, the electric product has been developed rapidly and applied in complex environment; especially, the electric product tends to be integrated, miniaturized and modularized. Therefore, the electric product shall be more stable; factors influencing stability of electric product include: damp, dust, invasion of correosive substances, mechanical vibration and external force etc., as well as thermal conduction for high-power electric products. So, various technical measures are required to ensure stability of performance parameters of electric products.

Organosilicone product has excellent properties of high/low temperature resistance, electric insulation, corrosion resistance, water/ageing resistance and ultraviolet resistance etc.; the heat conductivity of pure organic silicon resin can be about 0.2 W/(m·K), even higher if technology for improving conductivity is adopted, such as Chinese patent 200710022980.5 and 200910214244.9. the process of organosilicone material is relatively simple, thus it is quite applicable for industrial production to ensure the stability of performance parameters of electric products.

CONTENT OF INVENTION

This invention describes how to produce an addition-type organosilicon sealant for halogen-free conductive and flame-resistant electric products.

This invention is realized by the following technical schemes:

This addition-type organosilicon sealant for halogen-free conductive and flame-resistant electric products consists of:

A) The vinyl silicone oil, with viscosity of 200~20000 mPa·s, is a mixture of two parts of vinyl silicone oils with different viscosities. The vinyl silicone oil has the following structural formula:

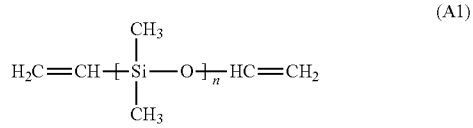

(A1)

The vinyl silicone oil is a mixture of two kinds of vinyl silicone oils with the above (A1) and the following (A2) structural formula; in which, the content of A1 is 60-100% (by weight) and the content of A2 is 0-40% (by weight);

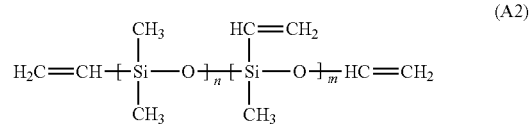

(A2)

where, n and m are integer (excluding zero).

B) is silicon dioxide treated by silane or aluminium oxide treated by silane, the silicon dioxide may be ball-type, crystal-type or melt-type; aluminium oxide may be ball-type with grain size of 1-50 μm. The mixture of silicon dioxide with grain size of 1-5 μm and 5~10 μm is selected as filler.

The said silicon dioxide treated by silane or aluminium oxide treated by silane is produced by the following steps: add the said vinyl silicone oil and silicon dioxide or aluminium oxide into a kneader, and then slowly add organosiloxane into the same kneader and heat to 60° C.-150° C. for 1-24 h; then, heat the kneader to 160° C.-220° C. to remove low molecule in vacuum, the product is silicon dioxide and aluminium oxide treated by silane.

During silane treatment, add 20-500 parts (by weight) of silicon dioxide or 20-1500 parts (by weight) of aluminium oxide into 100 parts (by weight) of vinyl silicone oil, the dosage of organosiloxane is 0.1%-10% of that of silicon dioxide or aluminium oxide.

C) A compound in which every molecule contains H—Si functional group, the mass content of H is 0.1-1.2%, and the mixture of two or more compounds with different contents of H are adopted; the molar ratio of H—Si and vinyl in such compound is 0.6-3; the said compound has the following structural formula:

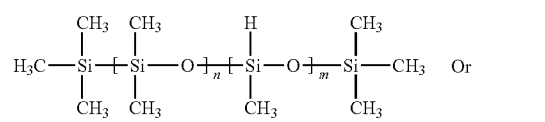

(C1)

Or

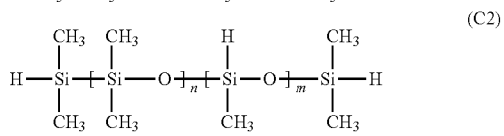

(C2)

where, n and m are integer (excluding zero).

Compound with structural formula of C2 is Preferred.

D) A compound, its dosage is 0.1-5 parts, preferred dosage is 0.3-2 parts; the said compound is hydrolysis product from hydrolysis reaction between Vinyl trimethoxy(triethoxy) silane and γ-(2,3-epoxy propoxy) propyl trimethoxy(triethoxy) silane.

The reactant of the said hydrolysis product and γ-aminopropyl trimethoxy(triethoxy) silane is preferred.

E) E is chloroplatinic acid or 1,3-divinyl-1,1,3,3-tetramethyl disiloxane platinum complex, the dosage is 2-200 PPm of the compex; 1,3-divinyl-1,1,3,3-tetramethyl disiloxane platinum is preferred, the dosage is 5~100 PPm.

F) F is any one or combination of carbon black, iron black, titanium dioxide, cerium oxide, benzotriazole, zinc carbonate, magnesium carbonate; the dosage is 0.01-50 parts (by weight); carbon black, titanium dioxide and zinc carbonate are preferred, the dosage is 0.5-50 parts (by weight).

Note: the symbols n and m used in the different structural formula mentioned above are only numerical codes and do not represent the same value.

In this invention, the heat conduction and flame resistance are realized by adding silicon dioxide treated by silane or aluminium oxide treated by silane; interface adhesion is improved by adding adhesive promoter; organic silicone elastomer with network structure is formed by additive reaction of vinyl silicone oil and silicone oil containing hydrogen; such elastomer, which is halogen-free and flame-resistant with certain heat conductivity and viscosity, is quite applicable to sealing of electric products.

SPECIFIC MODE OF IMPLEMENTATION

Implementation of this invention is described in detail as follows.

The products A, C, D and E mentioned above can be obtained by known methods; B and F can be obtained in market.

The main parameters and test method for addition-type organosilicon sealant for halogen-free conductive and flame-resistant electric products are as follows: curing condition is 125° C. for 60 min for all cases.

GB/T 528-1998 Vulcanized Rubber or thermoplastic Rubber—Determination of Tensile Stress-strain Properties, with thickness of 2 mm.

GB/T 1692-2008 Vulcanized Rubber—Determination of Insulation Resistivity, with thickness of 1 mm.

ANSI/UL 94-2006 Flammability Test of Plastic Material for Equipment Parts, with thickness of 3 mm.

GB/T 7124-2008 Adhesives—Determination of tensile shear strength (rigid-to-rigid material), with aluminum-to-aluminum bonding.

GB/T 10294-2008 Thermal Insulation—Determination of Steady-state Thermal Rresistance and Related Properties—Guarded Hot Plate Apparatus GB/T 1695-2005 Vulcanized Rubber-Determination of Electrical Breakdown Strength and Voltage Resistant at Commercial Power Frequency This invention may be further explained by the following embodiments.

Embodiment 1

100 parts (by weight) of vinyl silicone oil (A1) with viscosity of 500 mPa·s; 200 parts (by weight) of silicon dioxide treated by silane; 2 parts (by weight) of carbon black; 20 parts (by weight) of titanium dioxide; 1.5 parts (by weight) of adhesive promoter; 12 parts (by weight) of silicone oil containing hydrogen (C2); 100 ppm of 1,3-divinyl-1,1,3,3-tetramethyl disiloxane platinum complex.

Embodiment 2

Use the reactant of adhesive promoter D and γ-aminopropyl triethoxy silane to substitute the adhesive promoter (D) mentioned in Embodiment 1.

Embodiment 3

Use the following vinyl silicone oils to substitute the vinyl silicone oil (A1) mentioned in Embodiment 1: 75 parts (by weight) of vinyl silicone oil (A1) with viscosity of 500 mPa·s, 20 parts (by weight) of vinyl silicone oil (A1) with viscosity of 10000 mPa·s, 5 parts (by weight) of vinyl silicone oil (A2) with viscosity of 5000 mPa·s; 16 parts (by weight) of silicone oil containg hydrogen (C2), and others remain unchanged.

Embodiment 4

Use 30 parts (by weight) of magnesium carbonate to substitute titanium dioxide mentioned in Embodiment 1.

Embodiment 5

Use 300 parts (by weight) of aluminium oxide to substitute silicon dioxide mentioned in Embodiment 1.

Comparison 1

Exclude titanium dioxide from Embodiment 1.

Comparison 2

Exclude adhesive promoter from Embodiment 1.

The table below proves this invention is halogen-free, heat conductive and flame-resistant with certain viscosity. It can be widely applied to sealing of electric products.

|  | Embodiment 1 | Embodiment 2 | Embodiment 3 | Embodiment 4 | Embodiment 5 | Comparison 1 | Comparison 2 |
|---|---|---|---|---|---|---|---|
| Tensile strength (MPa) | 3.5 | 3.2 | 3.9 | 3.0 | 3.6 | 3.2 | 3.4 |
| Shear strength (Mpa) | 1.5 | 1.8 | 1.6 | 1.2 | 1.8 | 1.3 | 0.2 |
| Volume resistance (Ω·cm) | $2.0 \times 10^{15}$ | $1.6 \times 10^{15}$ | $5.2 \times 10^{15}$ | $8.5 \times 10^{14}$ | $7.6 \times 10^{14}$ | $1.1 \times 10^{15}$ | $1.8 \times 10^{15}$ |
| Breakdown strength (kV/mm) | 24.6 | 24.1 | 25.2 | 22.5 | 20.8 | 24.2 | 24.3 |
| Heat conductivity (W/(m·K)) | 0.76 | 0.76 | 0.76 | 0.77 | 0.95 | 0.72 | 0.76 |
| Flame resistance (UL94 V-0) | Pass | Pass | Pass | Pass | Pass | Bad | Pass |
| Halogen content | N.D. | N.D. | N.D. | N.D. | N.D. | N.D. | N.D. |

The invention claimed is:

1. An addition-type organosilicon composition comprising:
   A) 100 parts (by weight) of vinyl silicone oil;
   B) 10-500 parts (by weight) of silicon dioxide treated by silane or 20-1500 parts (by weight) of aluminium oxide treated by silane;
   C) a compound in which every molecule of the compound contains a H—Si functional group, wherein a mass content of H in the H—Si functional group is 0.1-1.2%;
   D) 0.1-5 parts (by weight) of a first product by a reaction between Vinyl trimethoxy(triethoxy) silane and γ-2,3-epoxy propoxy) propyl trimethoxy(triethoxy) silane, or 0.1-5 parts (by weight) of a second product by a reaction between the first product and γ-aminopropyl trimethoxy (triethoxy) silane;
   E) 2-200 ppm of Chloroplatinic acid or 1,3-divinyl-1,1,3, 3-tetramethyl disiloxane platinum complex; and
   F) 0.01-50 parts of any one or combination of carbon black, iron black, titanium dioxide, cerium oxide, benzotriazole, zinc carbonate, and magnesium carbonate;
   wherein a molecular ratio of the H—Si functional group and vinyl from the vinyl silicone oil in the composition is 0.6-3, and
   a grain size of the silicon dioxide treated by silane or the aluminium oxide treated by silane is 1-50 μm.

2. The composition according to the claim 1, wherein the vinyl silicone oil is a mixture of two or more kinds of vinyl silicone oils with different viscosity.

3. The composition according to claim 2, wherein one of the two or more kinds of vinyl silicone oils has a structural formula of:

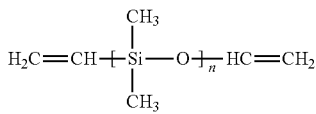

wherein, n is a non-zero integer.

4. The composition according to claim 2, wherein the vinyl silicone oil is a mixture containing 60-100% (by weight) of a first type of vinyl silicone oil having a structural formula of:

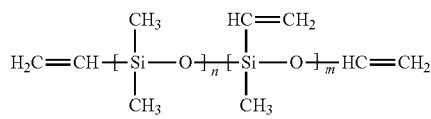

and 0-40% (by weight) of a second type of vinyl silicone oil

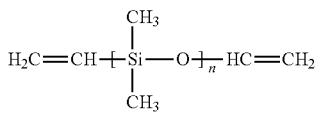

wherein, n and m are non-zero integers.

5. The composition according to claim 1, wherein the vinyl silicone oil has a structural formula of:

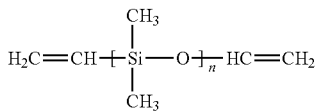

wherein, n is a non-zero integer.

6. The composition according to claim 1, wherein the vinyl silicone oil is a mixture containing 60-100% (by weight) of a first vinyl silicone oil having a structural formula of:

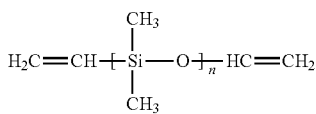

and 0-40% (by weight) of a second vinyl silicone oil having a structural formula of:

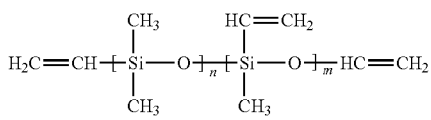

wherein, n and m are non-zero integers.

7. The composition according to claim 1, wherein the silicon dioxide treated by silane or the aluminium oxide treated by silane is a product produced by the steps of:
 adding the vinyl silicone oil and silicon dioxide or aluminium oxide into a kneader;
 adding silane into the kneader;
 heating the kneader to 60° C.-150° C. for 1-24 h; and then heating the kneader to 160° C.-220° C. so as to remove low volatile molecules in vacuum.

8. The composition according to claim 7, wherein adding the vinyl silicone oil and the silicon dioxide or the aluminium oxide into a kneader includes:
 adding 20-500 parts (by weight) of the silicon dioxide or 20-1500 parts (by weight) of the aluminium oxide into 100 parts (by weight) of the vinyl silicone oil; and
 wherein adding the silane into the kneader includes wherein the silane is 0.1%-10% (by weight) of the added silicon dioxide or aluminium oxide.

9. The composition according to claim 1, wherein the silicon dioxide treated by silane or the aluminium oxide treated by silane is a product produced by the steps of:
 adding the vinyl silicone oil and silicon dioxide or aluminium oxide into a kneader,
 adding silane into the kneader;
 heating the kneader to 60° C.-150° C. for 1-24 h; and then heating the kneader to 160° C.-220° C. so as to remove low volatile molecules in vacuum.

10. The composition according to claim 9,
 wherein adding the vinyl silicone oil and silicon dioxide or aluminium oxide into a kneader includes:
 adding 20-500 parts (by weight) of the silicon dioxide or 20-1500 parts (by weight) of the aluminium oxide into 100 parts (by weight) of the vinyl silicone oil; and
 wherein adding the silane into the kneader includes wherein the silane is 0.1%-10% (by weight) of the added silicon dioxide or aluminium oxide.

11. A method of using the composition of claim 1, comprising:
 applying the composition to an electric product; and
 curing the electric product to form a halogen-free, heat conductive and flame-resistant sealant on the electric product.

* * * * *